US012604412B2

(12) United States Patent
Dai

(10) Patent No.: US 12,604,412 B2
(45) Date of Patent: Apr. 14, 2026

(54) DISPLAY MODULE AND DISPLAY DEVICE

(71) Applicant: Hubei Yangtze Industrial Innovation Center of Advanced Display Co., LTD., Wuhan (CN)

(72) Inventor: Xin Dai, Wuhan (CN)

(73) Assignee: Hubei Yangtze Industrial Innovation Center of Advanced Display Co., LTD., Wuhan (CN)

( * ) Notice: Subject to any disclaimer, the term of this patent is extended or adjusted under 35 U.S.C. 154(b) by 232 days.

(21) Appl. No.: 18/594,031

(22) Filed: Mar. 4, 2024

(65) Prior Publication Data

US 2025/0071908 A1 Feb. 27, 2025

(30) Foreign Application Priority Data

Aug. 25, 2023 (CN) .......................... 202311090693.3

(51) Int. Cl.
*H05K 1/18* (2006.01)
*H05K 1/189* (2026.01)
*H05K 9/00* (2006.01)

(52) U.S. Cl.
CPC ........... *H05K 1/189* (2013.01); *H05K 9/0054* (2013.01); *H05K 2201/10128* (2013.01)

(58) Field of Classification Search
CPC ................. H05K 1/189; H05K 9/0054; H05K 2201/10128

USPC .......................................................... 361/749
See application file for complete search history.

(56) References Cited

U.S. PATENT DOCUMENTS

2006/0014463 A1* 1/2006 Yoshida .................. B32B 37/06
442/399
2021/0142715 A1* 5/2021 Wang ....................... G06F 3/147

FOREIGN PATENT DOCUMENTS

CN 215162316 U 12/2021

* cited by examiner

*Primary Examiner* — Binh B Tran
(74) *Attorney, Agent, or Firm* — Anova Law Group, PLLC

(57) ABSTRACT

A display module includes a display panel, a flexible circuit board, a conductive cloth, and a compensation structure. The display panel includes a first binding area disposed on a non-light-exiting surface. The flexible circuit board includes a first portion bound to the first binding area of the display panel. The conductive cloth is located on one side of the flexible circuit board away from the display panel, and covering at least a portion of the first binding area. The compensation structure is in contact with at least a portion of a side surface, and the conductive cloth covers the compensation structure. The conductive cloth includes a main body portion and an extension portion that is located on both sides of the main body portion along the second direction and connected to the main body portion.

19 Claims, 15 Drawing Sheets

100

100

A

A    Q1

50/51

M01

M03

θ

M02

B-B

C-C

C-C

200

100

DISPLAY MODULE AND DISPLAY DEVICE

CROSS-REFERENCE TO RELATED APPLICATION

This application claims priority to Chinese Patent Application No. 202311090693.3, filed on Aug. 25, 2023, the entire content of which is incorporated herein by reference.

TECHNICAL FIELD

The present disclosure relates to the field of display technology and, in particular, to a display module and a display device.

BACKGROUND

From CRT (Cathode Ray Tube) era to liquid crystal display (LCD) era, and now to an era of OLED (Organic Light-Emitting Diode) era and light-emitting diode display, display industry has changed rapidly after decades of development. The display industry has been closely related to our lives. From traditional mobile phones, tablets, TVs and PCs to current electronic devices such as smart wearable devices, VR, and car displays, they are all inseparable from display technology.

In a display product, a display panel is bound to a flexible circuit board, and electrical signals are obtained through the flexible circuit board. However, a binding place between the flexible circuit board and the display panel has poor waterproof performance, causing liquid to penetrate into a binding place and cause display abnormalities.

SUMMARY

In accordance with the disclosure, there is provided a display module including a display panel. The display panel has a first binding area disposed on a non-light-exiting surface. The display module has a flexible circuit board. The flexible circuit board includes a first portion bound to the first binding area of the display panel. The first portion includes a first surface and a second surface oppositely arranged along a first direction. The first surface is disposed between the second surface and the display panel. The first direction is perpendicular to a light-exiting surface of the display panel. The first portion includes a side surface located between the first surface and the second surface. The side surface includes a first side surface, a second side surface, and a third side surface. The first side surface and the second side surface are oppositely arranged along a second direction, and the third side surface connects to the first side surface and the second side surface. The display module has a conductive cloth, located on one side of the flexible circuit board away from the display panel, and covering at least a portion of the first binding area. The display module has a compensation structure which is in contact with at least a portion of the side surface, and the conductive cloth covers the compensation structure. It is also possible that the conductive cloth has a main body portion and an extension portion that is located on both sides of the main body portion along the second direction. The extension portion connects to the main body portion, the main body portion is in contact with the second surface, and the extension portion is located on both sides of the third side surface along the second direction.

Also in accordance with the disclosure, there is provided a display device. The display device has a display module.

The display module has a display panel. The display panel has a first binding area disposed on a non-light-exiting surface. The display module has a flexible circuit board. The flexible circuit board includes a first portion bound to the first binding area of the display panel. The first portion includes a first surface and a second surface oppositely arranged along a first direction. The first surface is disposed between the second surface and the display panel. The first direction is perpendicular to a light-exiting surface of the display panel. The first portion includes a side surface located between the first surface and the second surface. The side surface includes a first side surface, a second side surface, and a third side surface. The first side surface and the second side surface are oppositely arranged along a second direction, and the third side surface connects to the first side surface and the second side surface. The display module has a conductive cloth, located on one side of the flexible circuit board away from the display panel, and covering at least a portion of the first binding area. The display module has a compensation structure which is in contact with at least a portion of the side surface, and the conductive cloth covers the compensation structure. It is also possible that the conductive cloth has a main body portion and an extension portion that is located on both sides of the main body portion along the second direction. The extension portion connects to the main body portion, the main body portion is in contact with the second surface, and the extension portion is located on both sides of the third side surface along the second direction.

BRIEF DESCRIPTION OF THE DRAWINGS

The accompanying drawings, which are incorporated in and constitute a part of this specification, illustrate embodiments of the present disclosure and together with the description, serve to explain the principles of the present disclosure.

DETAILED DESCRIPTION OF THE EMBODIMENTS

Embodiments of the present disclosure are described in detail with reference to the accompanying drawings. It should be noted that the relative arrangement of components and steps, numerical expressions, and numerical values set forth in these examples do not limit the scope of the disclosure unless otherwise specifically stated.

The following description of embodiments of the present disclosure is merely illustrative in nature and is in no way intended to limit the scope of the present disclosure and the application or the use of the present disclosure.

Techniques, methods, and devices known to those persons of ordinary skill in the art may not be discussed in detail, but where appropriate, the techniques, methods and devices should be considered a part of the specification.

In all examples presented and discussed in the present disclosure, specific values are to be construed as illustrative only rather than limiting. Accordingly, other examples of the exemplary embodiments may have different values.

It will be apparent to those persons of ordinary skill in the art that various modifications and variations can be made in the present disclosure without departing from the spirit or scope of the invention. Thus, the present disclosure intends to cover the scope of the modifications and variations of the present disclosure corresponding to the claims (claimed technical approaches) and their equivalents. It should be noted that the implementations provided by embodiments of the present disclosure can be combined with each other if there is no contradiction.

It should be noted that similar reference numbers and letters refer to similar items in the following figures, so that once an item is defined in one figure, it does not require further discussion in subsequent figures.

Figure 1:
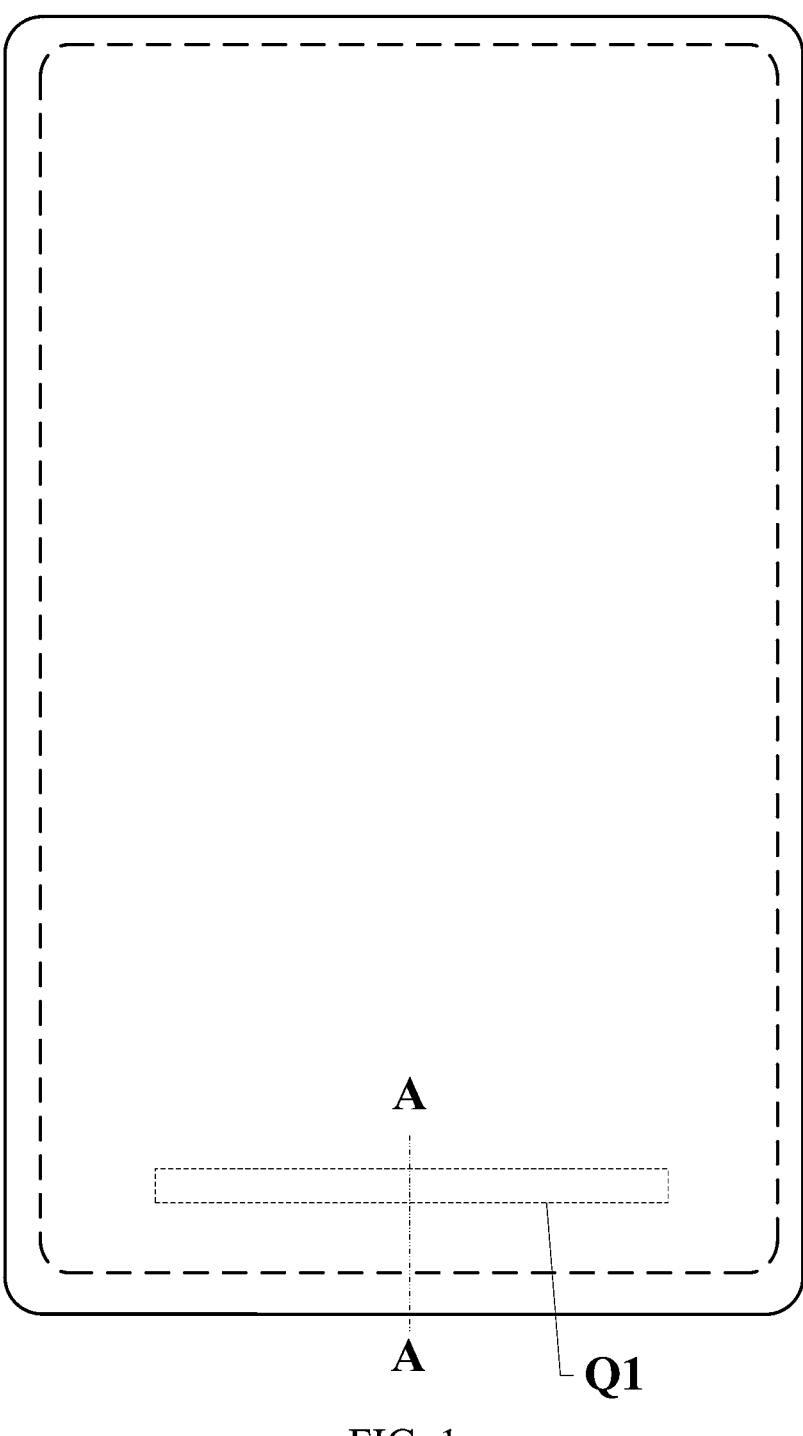
FIG. 1 illustrates a top view of a display module according to embodiments of the present disclosure.
Figure 2:
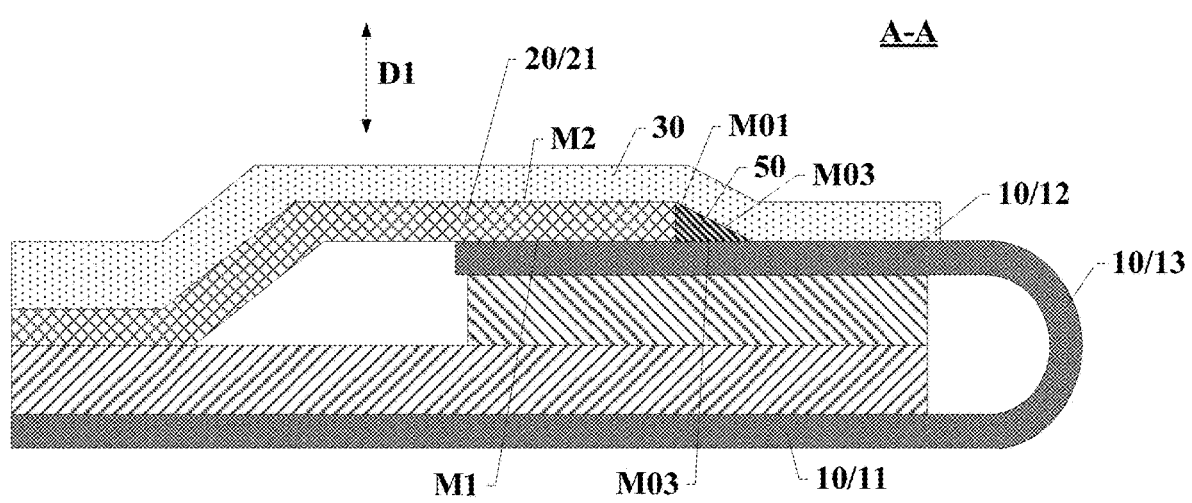
FIG. 2 illustrates a cross-sectional view of the display module along the AA direction in FIG. 1.
Figure 3:
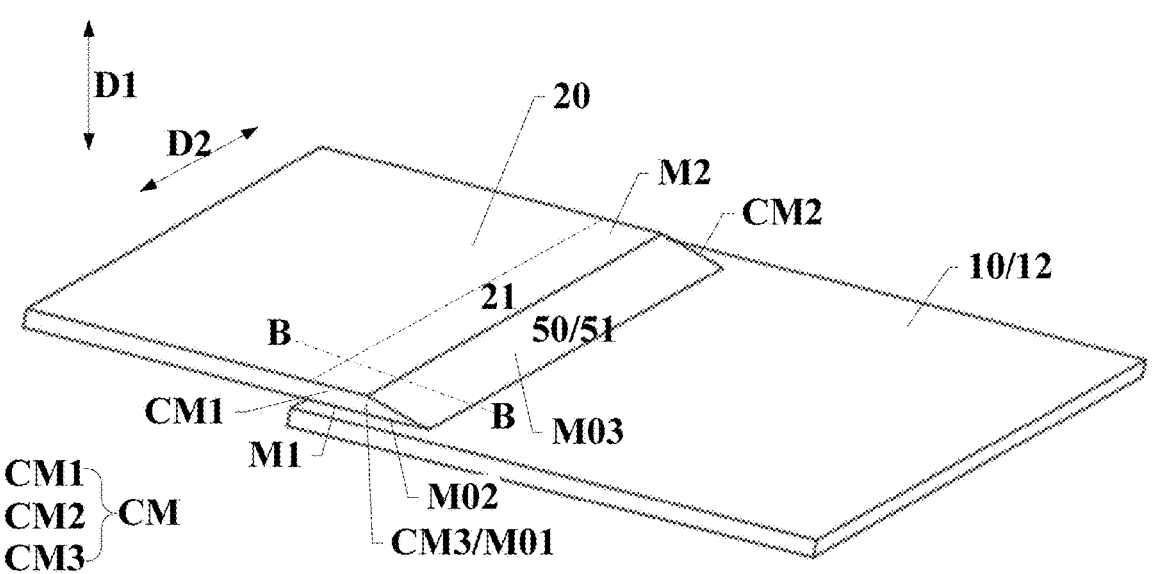
FIG. 3 illustrates a relative positional relationship diagram between a display panel and a flexible circuit board according to embodiments of the present disclosure.
Figure 4:
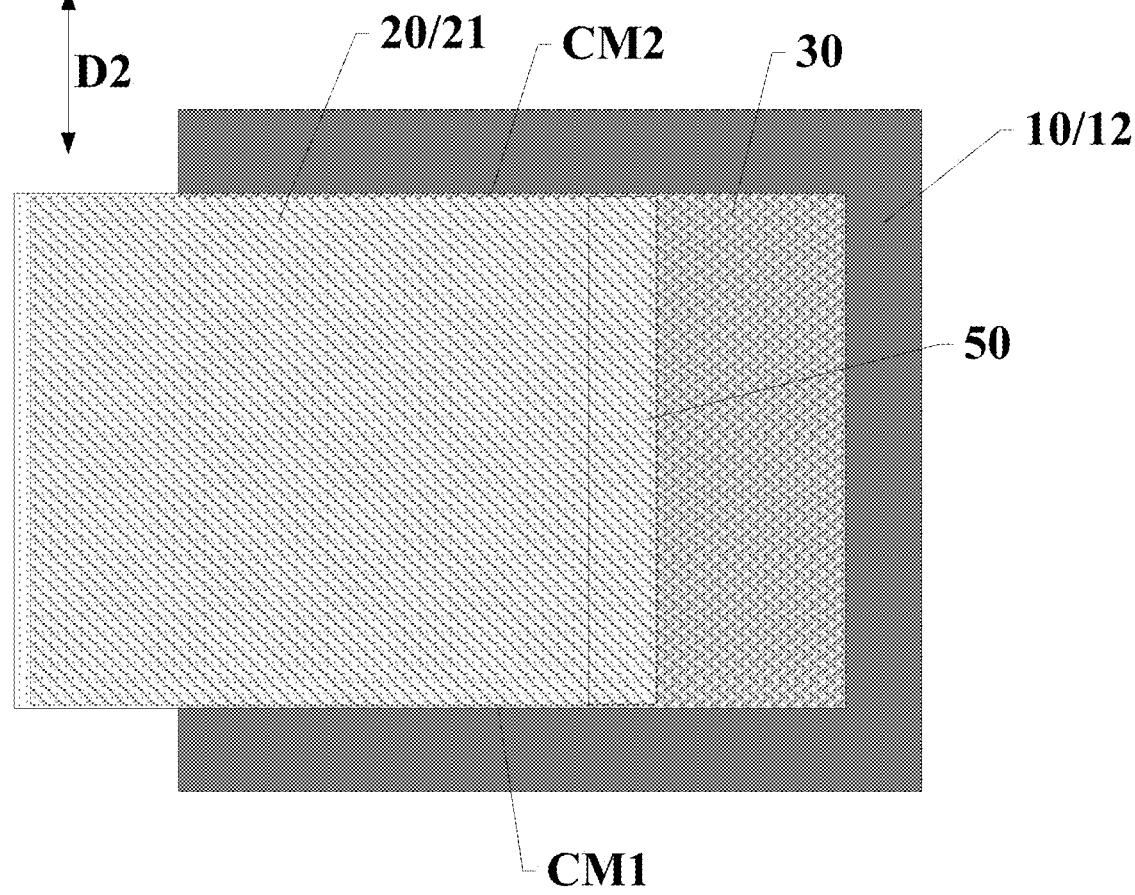
FIG. 4 illustrates a relative positional relationship diagram of a display panel, a flexible circuit board, and a conductive cloth corresponding to a structure in FIG. 2 and FIG. 3.
Figure 5:
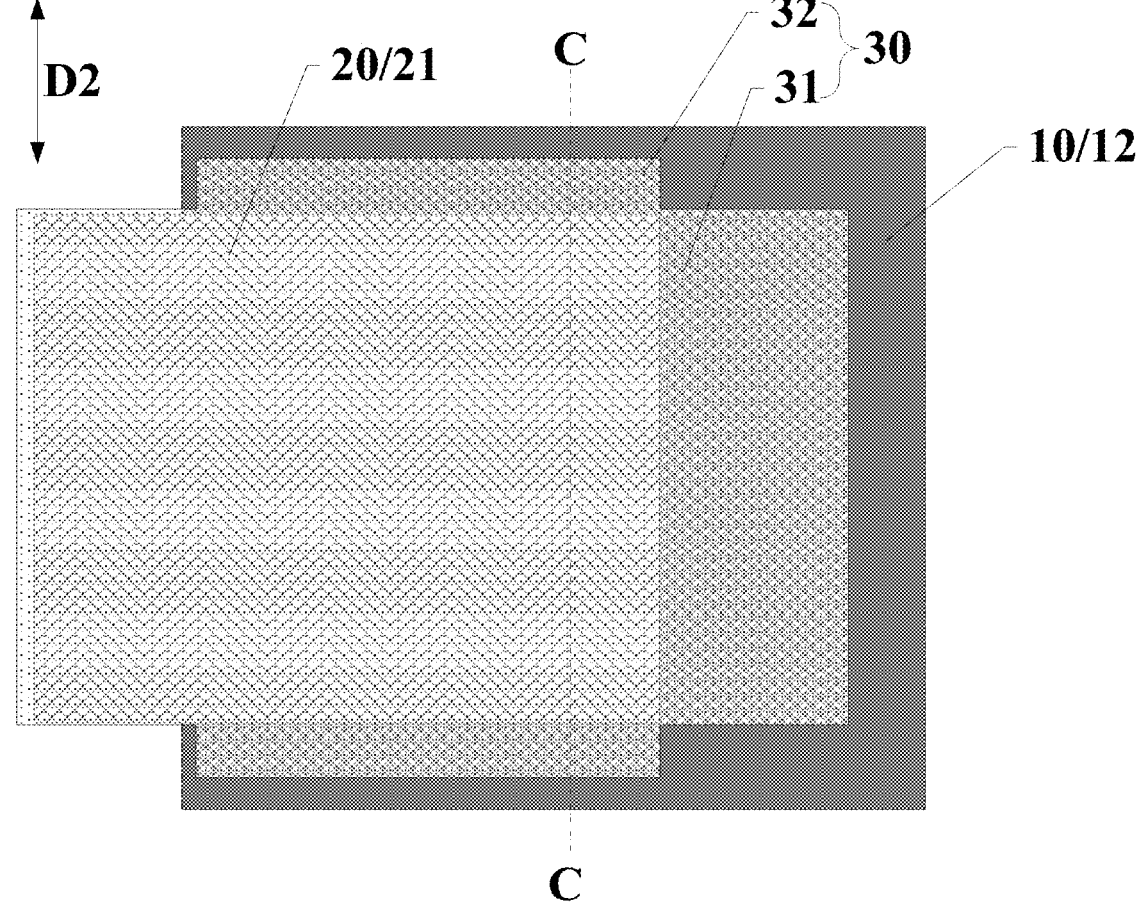
FIG. 5 illustrates a relative positional relationship diagram of a display panel, a flexible circuit board, and a conductive cloth when the conductive cloth includes an extension portion.

FIG. 1 is a top view of a display module according to embodiments of the present disclosure. FIG. 2 shows a cross-sectional view of the display module along the AA direction in FIG. 1. FIG. 3 is a relative positional relationship diagram between a display panel and a flexible circuit board according to embodiments of the present disclosure. FIG. 4 is a relative positional relationship diagram of the display panel, the flexible circuit board, and a conductive cloth corresponding to a structure in FIG. 2 and FIG. 3. FIG. 5 is a relative positional relationship diagram of the display panel, the flexible circuit board, and the conductive cloth when the conductive cloth includes an extension portion. Please refer to FIG. 1 to FIG. 5, embodiments of the present disclosure provide a display module 100 that includes a display panel 10. The display panel 10 includes a first binding area Q1 disposed on a non-light-exiting surface.

The display module 100 further includes a flexible circuit board 20. The flexible circuit board 20 includes a first portion 21 binding to a first binding area Q1 of a display panel 10. The first portion 21 includes a first surface M1 and a second surface M2 that are oppositely arranged along a first direction D1. The first surface M1 is located between the second surface M2 and the display panel 10. The first direction D1 is perpendicular to a light-exiting surface of the display panel 10. The first portion 21 includes a side surface CM located between the first surface M1 and the second surface M2. The side surface CM includes a first side surface CM1, a second side surface CM2, and a third side surface CM3. The first side surface CM1 and the second side surface CM2 are arranged oppositely along a second direction D2. The third side surface CM3 is connected to the first side CM1 and the second side CM2 respectively.

The display module 100 further includes a conductive cloth 30, located on one side of the flexible circuit board 20 away from the display panel 10 and covering at least a portion of the first binding area Q1.

Please refer to FIG. 2 to FIG. 4, the display module also includes a compensation structure 50. The compensation structure 50 is in contact with at least a portion of the side surface CM, and the conductive cloth 30 covers the compensation structure 50. In some embodiments, please refer to FIG. 1, FIG. 2 and FIG. 5, the conductive cloth 30 includes a main body portion 31 and an extension portion 32. The conductive cloth 30 is located on both sides of the main body portion 31 along the second direction D2 and connected to the main body portion 31. The main body portion 31 is in contact with the second surface M2, and the extension portion 32 is located on both sides of the third side surface CM3 along the second direction D2.

It should be noted that FIG. 1 only takes a display module with a rounded rectangular structure as an example to illustrate the display module provided by embodiments of the present disclosure. FIG. 1 does not limit an actual shape of the display module. In some embodiments, the display module may also be embodied as a rectangular, circular, or a special-shaped structure such as an arc edge.

The cross-sectional view of FIG. 2 only illustrates a relative positional relationship between the display panel 10, the flexible circuit board 20, and the conductive cloth 30, rather than defines an actual film layer structure of the display panel 10, the flexible circuit board 20, or the conductive cloth 30. For the actual film layer structure of the display panel 10, the flexible circuit board 20, and the conductive cloth 30, the present disclosure does not specifically limit. It should be noted that, in order to clearly illustrate the positional relationship between the display panel 10 and the flexible circuit board 20, the display panel 10 and the flexible circuit board 20 are also not illustrated with fillings in FIG. 3. Similarly, FIG. 4 and FIG. 5 only show a partial structure of the display panel 10 and the flexible circuit board 20, and do not limit an actual film layer structure of the display panel 10 and the flexible circuit board 20.

Optionally, the display panel 10 provided in embodiments of the present disclosure is a flexible display panel, for example an OLED display panel 10. The portion of the flexible display panel 10 bound to the flexible circuit board 20 is bent to the non-light-exiting surface through a bending portion. The portion of the display panel 10 bound to the flexible circuit board 20 is bent to the non-light-exiting surface through the bending portion, which is beneficial to reducing a width of a lower frame of the display module, achieving a narrow lower frame design of the display module, and increasing a screen-to-body ratio of a panel product.

The display panel 10 provided by embodiments of the present invention includes a first binding area Q1 for binding the flexible circuit board 20. When the flexible circuit board 20 is bound to the first binding area Q1, a portion of the flexible circuit board 20 bound to the first binding area Q1 of the display panel 10 is a first portion 21. The first portion 21 can be regarded as a portion of the flexible circuit board 20 that is in contact with the display panel 10. The first portion 21 includes a first surface M1 and a second surface M2 that are oppositely arranged along the first direction D1. A side surface CM is arranged between the first surface M1 and the second surface M2. The second surface M2 can be regarded as a surface of the first portion 21 away from the display panel 10. The first surface M1 can be regarded as a surface of the first portion 21 facing the display panel 10, or a surface bound to the first binding area Q1. A side surface of the first part 21 includes a first side surface CM1 and a second side surface CM2 that are oppositely arranged along the second direction D2. The side surface of the first part 21 also includes a third side surface CM3 connecting the first side surface CM1 and the second side surface CM2.

After the first portion 21 of the flexible circuit board 20 is bound to the display panel 10, the conductive cloth 30 is covered on the side of the flexible circuit board 20 away from the display panel 10. The conductive cloth 30 covers at least a portion of the first binding area Q1.

Figure 6:
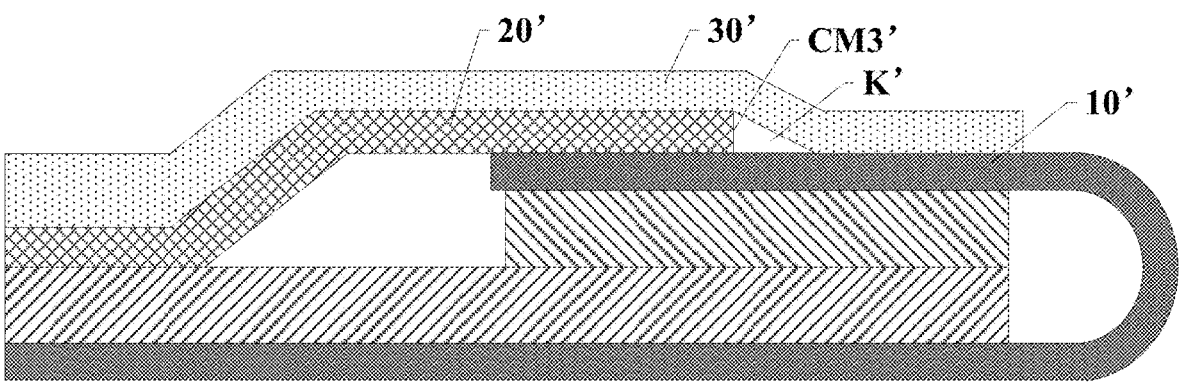
FIG. 6 illustrates a relative position diagram of a display panel, a flexible circuit board, and a conductive cloth in related technologies.
Figure 7:
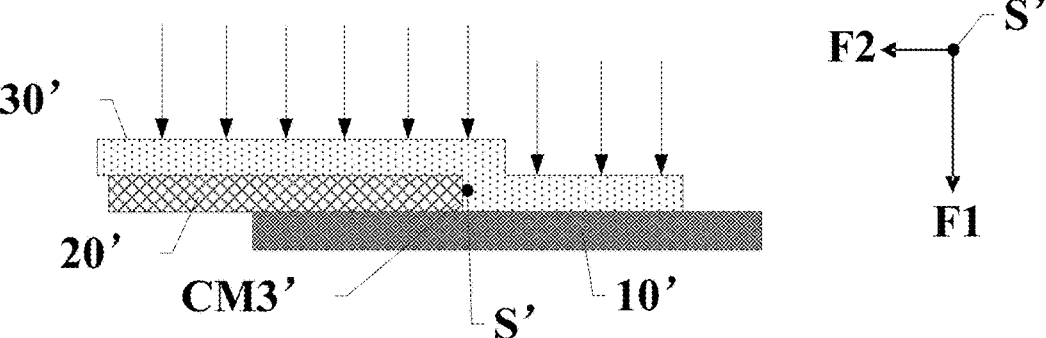
FIG. 7 illustrates the force analysis diagram corresponding to FIG. 6.

Please refer to FIG. 6, when the conductive cloth is disposed on a side of a flexible circuit board 20' away from a display panel 10', a third side surface CM3' of the flexible circuit board 20' is usually perpendicular to a first surface and a second surface of the flexible circuit board 20', or perpendicular to a display panel 10'. FIG. 6 shows a relative positional relationship diagram of the display panel 10', the flexible circuit board 20', and a conductive cloth 30'. FIG. 7 illustrates the force analysis diagram corresponding to FIG. 6. Take a point S' of the conductive cloth 30' at a position CM3' of a third side surface of the flexible circuit board 20' as a reference point for force analysis. When the third side surface CM3' is perpendicular to the display panel 10', the conductive cloth 30' is subjected to a downward adhesion force F1 at the reference point, while an adhesion force F2 of the conductive cloth 30' to the third side surface CM3' is almost 0. That is to say the conductive cloth 30' at a step difference position (a position corresponding to the third side surface CM3') cannot be effectively pressed. After the conductive cloth 30' and the flexible circuit board 20' are attached to each other, the step difference position (the position corresponding to the third side surface CM3') will bounce up and cause a false connection, resulting in a gap or a hole K between the conductive cloth 30' and the third side surface CM3', leading to poor waterproof performance. During an artificial sweat test, artificial sweat will penetrate into a binding place between the flexible circuit board 20' and the display panel 10' from the gap or the hole K', corroding a gold finger at the binding place, resulting in abnormal display.

Embodiments of the present disclosure improve the structure of the display module. One possible implementation method is that the display module also includes a compensation structure 50. Please refer to FIG. 2 to FIG. 4. The compensation structure 50 is connected to at least a portion of the side surface CM, and the conductive cloth 30 covers the compensation structure 50. It can be seen that this embodiment introduces a compensation structure 50 between the conductive cloth 30 and at least a portion of the side surface of the first portion 21 of the flexible circuit board 20. The compensation structure 50 is in contact with the side surface CM and the conductive cloth 30 respectively. By this way, the compensation structure 50 is used to make up for the step difference on the side surface of the flexible circuit board 20, increasing the binding reliability between the conductive cloth 30 and the compensation structure 50. It can also avoid a gap or a hole between the side surface of the flexible circuit board 20 and the conductive cloth 30. Therefore, it is helpful to avoid sweat and other liquids from penetrating into the binding place between the flexible circuit board 20 and the display panel 10 from the gap or the hole. The penetrated sweat and other liquids can cause issues of display abnormalities. Therefore, it is beneficial to improve the waterproof performance of the display module. Thus, the display stability of the display module is improved.

Another feasible implementation method provided by embodiments of the present disclosure is to improve a structure of the conductive cloth 30, as shown in FIG. 5 and FIG. 2. The conductive cloth 30 includes a main body portion 31 and an extension portion 32 located on both sides of the main body portion 31 along the second direction D2. The extension portion 32 is connected to the main body portion 31. The main body portion 31 is in contact with the second surface M2 of the flexible circuit board 20, and the extension portion 32 is located on both sides of the third side surface CM3 of the flexible circuit board 20 along the second direction D2. When the conductive cloth 30 is disposed on the side of the flexible circuit board 20 away from the display panel 10, in order to improve the binding reliability of the conductive cloth 30 in the display module, the conductive cloth 30 can be extended from the second surface M2 of the flexible circuit board 20 toward a direction of the bending portion of the display module and then adhered and fixed to the display panel 10. If the extension portion 32 is not introduced into the conductive cloth 30, at least a portion of both sides of the third side surface CM3 of the flexible circuit board 20 along the second direction D2 is exposed. Therefore, liquid is likely to penetrate into the binding place between the flexible circuit board 20 and the display panel 10 from the third side surface CM3 of the flexible circuit board 20 along both sides of the second direction D2. Therefore, embodiments of the present disclosure introduce an extension portion 32 connected to the main body portion 31 in the conductive cloth 30. The extension portion 32 is located on both sides of the third side surface CM3 of the flexible circuit board 20 along the second direction D2. In this way, the extension portion 32 can cover both sides of the third side surface CM3 of the flexible circuit board 20 along the second direction D2, blocking a path of liquid entering from both sides of the third side surface CM3 along the second direction D2 into the binding place of the flexible circuit board 20 and the display panel 10. It is also beneficial to improving the overall waterproof performance of the display module and a display stability of the display module.

Figure 8:
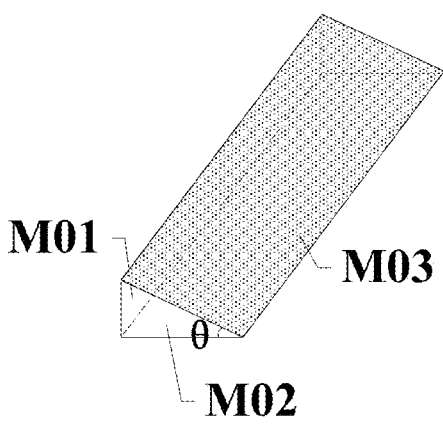
FIG. 8 illustrates a schematic structural diagram of a first inclined structure according to embodiments of the present disclosure.

Continuing to refer to FIG. 2, FIG. 3, and FIG. 8, FIG. 8 shows a schematic structural diagram of the first inclined structure 51 provided by embodiments of the present disclosure. It should be noted that in order to clearly illustrate a structure of the first inclined structure 51, in FIG. 8, only an inclined plane M03 in the first inclined structure 51 is filled, while other planes of the first inclined structure 51 are not filled. In an optional embodiment of the present disclosure, the compensation structure 50 includes a first inclined structure 51. The first inclined structure 51 includes a first plane M01 connected to the side surface CM, a second plane M02 connected to the display panel 10, and the inclined plane M03 connecting the first plane M01 and the second plane M02. The inclined plane M03 is not parallel to the first plane M01 or the second plane M02. The inclined plane M03 is located on a side of the first plane M01 away from the side surface. A side of the first plane M01 away from the display panel 10 is flush with the second surface M2.

Figure 9:
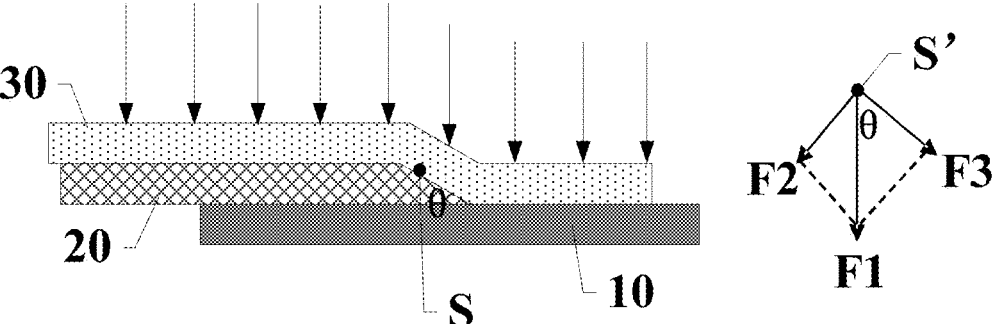
FIG. 9 illustrates a force analysis diagram corresponding to the conductive cloth and the first inclined structure in FIG. 2.

In some embodiments, a specific structure of the compensation structure 50 is described in detail. The compensation structure 50 can be represented as a structure similar to a triangular prism. In relation to the side surface of the first portion 21 of the flexible circuit board 20, it can be seen as a first inclined structure 51. The first inclined structure 51 is in contact with the flexible circuit board 20 and the display panel 10 respectively, including the first plane M01 connected to the side surface of the first portion 21 of the flexible circuit board 20 and the second plane M02 connected to the display panel 10. Among them, the first plane M01 and the second plane M02 are connected by an inclined plane M03. The inclined plane M03 intersects with both the first plane M01 and the second plane M02. Optionally, the first plane M01 and the second plane M02 are perpendicular. An angle between the inclined plane M03 and the first plane M01 is an acute angle. An angle between the inclined plane M03 and the second plane M02 is also an acute angle. The inclined plane M03 is located on one side of the first plane M01 away from the side surface, and is located on one side of the second plane M02 away from the display panel 10. The first inclined structure 51 is used to compensate for the step difference between the side surface of the first portion 21 of the flexible circuit board 20 and the display panel 10. FIG. 9 shows a force analysis diagram corresponding to the conductive cloth 30 and the first inclined structure 51 in FIG. 2. Take a point S on the inclined plane M03 of the first inclined structure 51 as a reference point for force analysis, when an angle between the inclined plane M03 and the second plane M02 is θ, the smaller θ is, the greater the binding force F2 that can be obtained by the conductive cloth 30 on the inclined plane M03 will be, and the better the binding effect will be. Therefore, embodiments of the present disclosure introduce the first inclined structure 51 to compensate the step difference between the first portion 21 of the flexible circuit board 20 and the display panel 10. This increases the binding force of the conductive cloth 30, effectively preventing an issue of an occurrence of a gap or a hole between the conductive cloth 30 and the first portion 21 of the flexible circuit board 20, thereby significantly enhancing the overall waterproof performance of the display module and improving the display reliability of the display module.

Continuing to refer to FIG. 8 and FIG. 9. In an optional embodiment of the present disclosure, an angle between the inclined plane M03 and the second plane M02 is θ, θ≤48.2°.

Take a point on the inclined plane M03 of the first inclined structure 51 as a reference point for force analysis. When the angle between the inclined plane M03 and the second plane M02 is θ, or when the slope angle is θ, the conductive cloth 30 is bound to the inclined plane M03 and subjected to a downward binding force F1, F2=F1×cos θ, the conductive cloth 30 at a position of the inclined plane M03 of the first inclined structure 51 can obtain a normal effective pressing force F2 and activate the viscosity of the conductive cloth 30. According to the formula F2=F1×cos θ, the smaller θ is and the larger F2 is, the greater the binding force on the conductive cloth 30 at the position of the inclined plane M03 of the first inclined structure 51 will be, and the better the binding effect will be. When F2≥an activation force of an adhesive element of the conductive cloth 30, θmax=arc (cos ((activation force of an adhesive element of conductive cloth 30)/F1)). When an activation force of a conventional conductive cloth 30 is about 20 N, the binding force F1 is about 30 N, thus it can be calculated that θmax=48.2°. Therefore, embodiments of the present disclosure set θ≤48.2°, which is beneficial to improving the binding force between the conductive cloth 30 and the inclined plane M03 of the first inclined structure 51. This also prevents an emergence of a gap or a hole between the conductive cloth 30 and the first side surface of the flexible circuit board 20, which will lead to an issue of liquid penetration, and better improve the overall waterproof performance and the display reliability of the display module.

Figure 10:
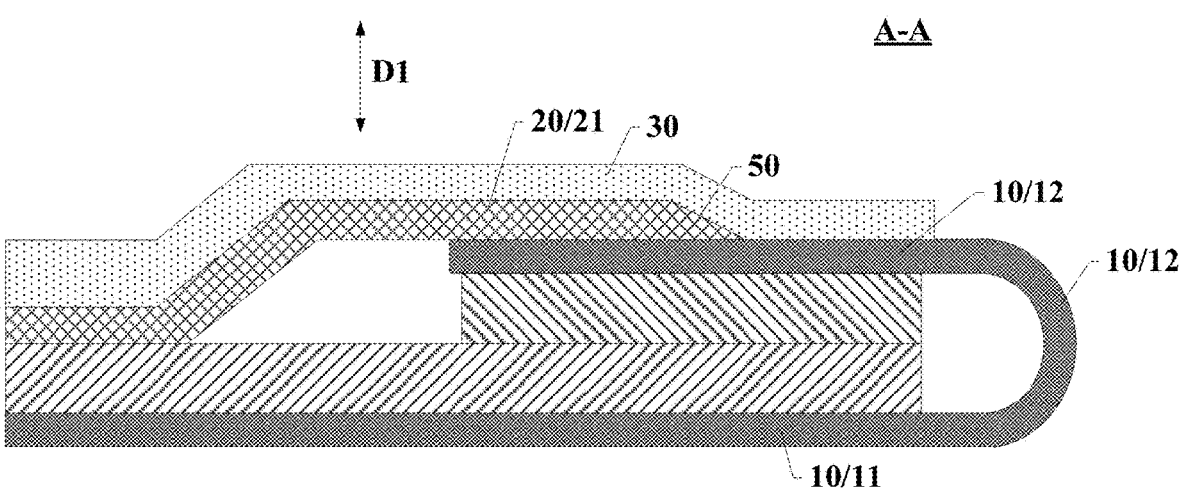
FIG. 10 illustrates another cross-sectional view of a display module along the AA direction in FIG. 1.

In practical applications, the first inclined structure 51 and the first portion 21 of the flexible circuit board 20 in some embodiments can be two independent structures, and fixed by pasting. In some embodiments, the first inclined structure 51 and the flexible circuit board 20 may also be integrated into a single structure. For example, FIG. 10 shows another AA cross-sectional view of the display module in FIG. 1. As shown in FIG. 10, in an optional embodiment, the first inclined structure 51 is integrally formed with the flexible circuit board 20 into a single piece. It should be noted that in some embodiments, the flexible circuit board 20 and the first inclined structure 51 are filled with the same filling material to represent that they are integrally formed into a single structure.

Specifically, when the first inclined structure 51 and the flexible circuit board 20 are an integrated structure, there is no need to add an additional structure in the display module to achieve fixation of the first inclined structure 51 to the flexible circuit board 20, thereby skipping a step of fixing the first inclined structure 51 to the flexible circuit board 20 and simplifying the manufacturing process of the display module. It should be noted that when the first inclined structure 51 and the flexible circuit board 20 are an integrated structure, a side of the flexible circuit board 20 that is connected to the first inclined structure 51 can be regarded as a virtual side.

In the actual manufacturing process, an inclined plane can be formed on one side of the flexible circuit board 20 through edge grinding technology. For example, a flexible circuit board 20 with conventional structure can be fixed on a fixed plate, and an electric motor can be used to drive an edge chamfering machine for edge and corner grinding. An original corner position is ground into an inclined surface.

This technology is relatively mature. Using an edge grinding technology to form the first inclined structure 51, integrating with the flexible circuit board 20, is beneficial to simplifying an overall manufacturing process of the display module and improving manufacturing efficiency.

Figure 11:
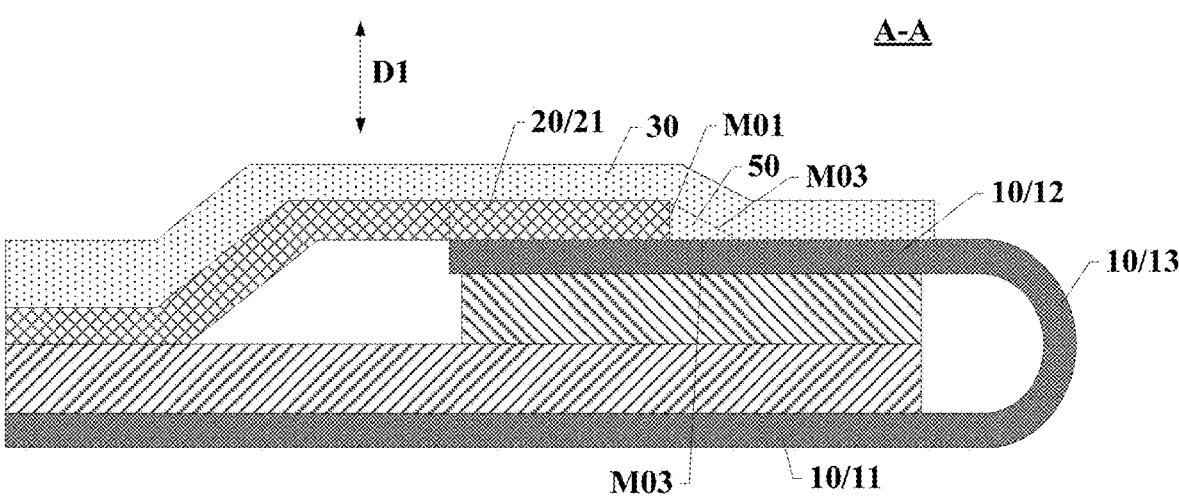
FIG. 11 illustrates another cross-sectional view of a display module along the AA direction in FIG. 1.
Figure 12:
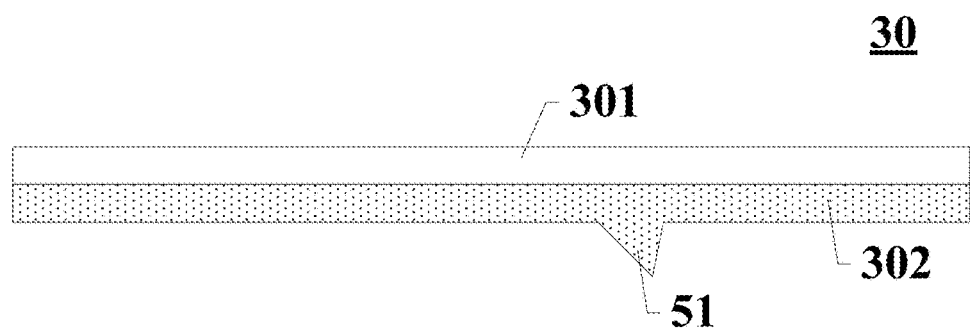
FIG. 12 illustrates a schematic structural diagram of a conductive cloth in FIG. 11.

FIG. 11 shows another AA cross-sectional view of the display module in FIG. 1. FIG. 12 shows a schematic structural diagram of the conductive cloth 30 in FIG. 11.

Please refer to FIG. 11 and FIG. 12. In an optional embodiment of the present disclosure, the conductive cloth 30 includes a base 301 and an adhesive element 302 disposed on one side of the base 301. The first inclined structure 51 and the adhesive element 302 are integrally formed.

Embodiments of the present disclosure illustrate another possible implementation of the first inclined structure 51. Specifically, the first inclined structure 51 provided on the first side surface CM1 of the flexible circuit board 20 is part of the conductive cloth 30. The conductive cloth 30 includes a base 301 and the adhesive element 302 disposed on one side of the base 301. The first inclined structure 51 and the adhesive element 302 are integrally formed. Therefore, the first inclined structure 51 can be seen as a protruding part of the structure that is disposed on the base 301 compared to a normal adhesive element 302. When the conductive cloth 30 is bound to the flexible circuit board 20 and the display panel 10, the first inclined structure 51 on the conductive cloth 30 is precisely bound to a portion of a side surface of the flexible circuit board 20 and at least a portion of a surface of the display panel 10 facing the first portion 21. In other words, the first inclined structure 51 is exactly bound at a position where a side surface of the first part 21 of the flexible circuit board 20 forms a step difference with the display panel 10. In this way, the first inclined structure 51 can also compensate for a step difference between the first part 21 and the display panel 10. As the first inclined structure 51 is integrally formed with the adhesive element 302 of the conductive cloth 30 into a single piece, introducing an irregularly shaped first inclined structure 51 to bind to the side surface of the first portion 21 enhances the binding force between the conductive cloth 30 and the side surface of the first portion 21. This is also helpful to avoid forming the gap or the hole for liquid penetration between the side surface of the first portion 21 of the flexible circuit board 20 and the conductive cloth 30. Therefore, it is also beneficial to improving the overall waterproof performance of the display module and the display reliability of the display module.

Continuing to refer to FIG. 2 and FIG. 3, in an optional embodiment of the present disclosure, at least a portion of the first inclined structure 51 is located on a side of the third side surface CM3 away from the first part 21. At least a portion of the first inclined structure 51 is connected to the third side surface CM3.

When the first inclined structure 51 is introduced into the display module, the first inclined structure 51 may be disposed on the third side surface CM3 of the first portion 21 of the flexible circuit board 20. A large step difference between the third side surface CM3 of the first portion 21 and the display panel 10 normally leads to an unfirmly binding between the conductive cloth 30 and the third side surface CM3 and an appearance of the gap and the hole, causing liquid penetration. In this embodiment, the first inclined structure 51 is introduced on one side of the third side CM3, which can just reduce the step difference between the third side surface CM3 and the display panel 10. The first inclined structure 51 is connected with the conductive cloth 30 and the third side respectively. Thus, this helps to avoid the issue of liquid penetration caused by the gap or the hole between the conductive cloth 30 and the third side surface CM3. Therefore, the overall waterproof performance of the display module is improved in a targeted manner, which is beneficial to improving the performance of the display stability of the display module.

Continuing to refer to FIG. 3, in an optional implementation of the present disclosure, along the second direction D2, a length of the first inclined structure 51 is equal to a length of the third side surface CM3.

Specifically, when a first inclined structure 51 is introduced on one side of the third side surface CM3 of the first portion 21 of the flexible circuit board 20, a length of the first inclined structure 51 along the second direction D2 is set to be equal to a length of the third side surface CM3 along the second direction D2, which means that the entire third side surface CM3 is covered by the first inclined structure 51, and a step difference between the entire third side surface CM3 and the display panel 10 is filled by the first inclined structure 51. Thus, it avoids the issue of liquid penetration caused by the gap or the hole between the entire third side CM3 and the conductive cloth 30, which is beneficial to improving a waterproof reliability of the display module.

Embodiments of the present disclosure shown in FIG. 3 takes as an example of a scheme in which the entire third side surface CM3 is covered by the first inclined structure 51. In some embodiments, a relative positional relationship of the third side surface CM3 and the first inclined structure 51 can also be embodied in other forms. For example, FIG. 13 shows a relative positional relationship diagram between the flexible circuit board 20 and the display panel 10 according to embodiments of the present disclosure.

Figure 13:
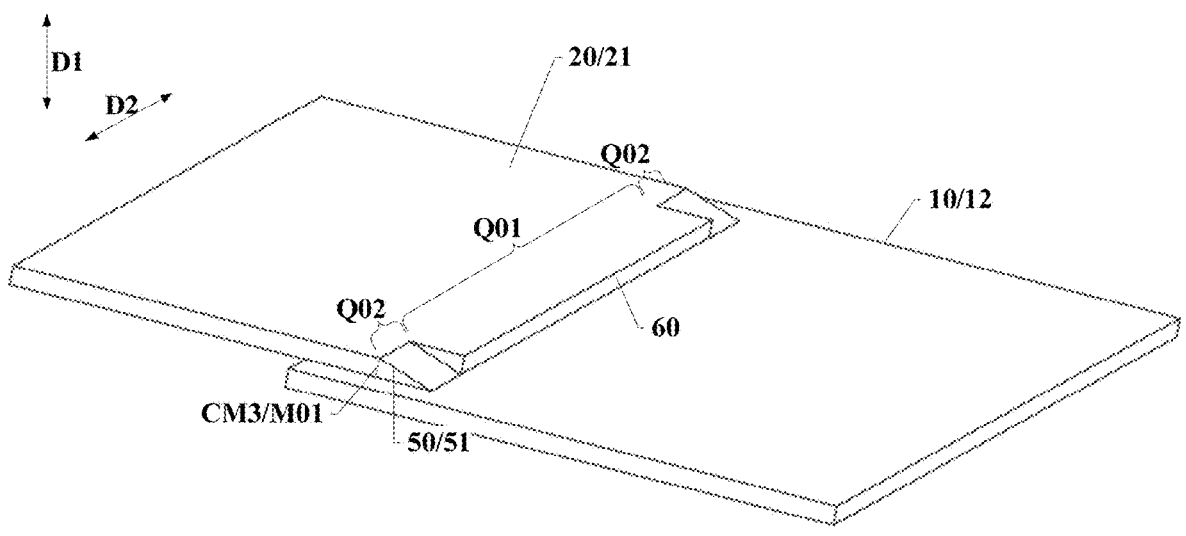
FIG. 13 illustrates a relative positional relationship diagram between a flexible circuit board and a display panel according to embodiments of the present disclosure.

As shown in FIG. 13, in an optional implementation of the present disclosure, along the second direction D2, a length of the first inclined structure 51 is less than a length of the third side surface CM3. The third side surface CM3 includes a first area Q01 and a second area Q02 located on both sides of the first area Q01 along the second direction D2. The first inclined structure 51 is located at least in the second area Q02.

Please refer to FIG. 6. When a conductive cloth 30' is bound to a flexible circuit board 20', due to a step difference between a third side surface CM3' of the flexible circuit board 20' and a display panel 10', a gap or a hole K' appears between the third side surface CM3' and the conductive cloth 30'. In some embodiments, external liquid will enter the gap or the hole through the third side surface CM3' along both sides of the second direction D2, and then may penetrate into the binding place of the flexible circuit board 20 and the display panel 10. In other words, the place on both sides of the third side surface CM3 along the second direction D2 is the first barrier for external liquid to penetrate. When the third side surface CM3 is divided into a first area Q01 and a second area Q02 located on both sides of the first area Q01 along the second direction D2, the second area Q02 is located at both ends of the third side surface CM3 along the second direction D2. If liquid penetrates, the liquid will first pass through the second area Q02, and then penetrate into the first area Q01. Therefore, embodiments of the present disclosure arrange the first inclined structure 51 at least at a place of the second area Q02 corresponding to the third side surface CM3. The first inclined structure 51 is used to compensate for the step difference between the second area Q02 of the third side surface CM3 and the display panel 10 to avoid the gap or the hole between the conductive cloth 30 and the third side surface CM3 at the place of the second area Q02. This can block the path of liquid penetration, which means that liquid cannot pass through the second area Q02 and move further to the position of the second area Q02. Thus, it is also beneficial to ensuring the waterproof reliability of the display module and improving the display reliability of the display module.

Figure 14:
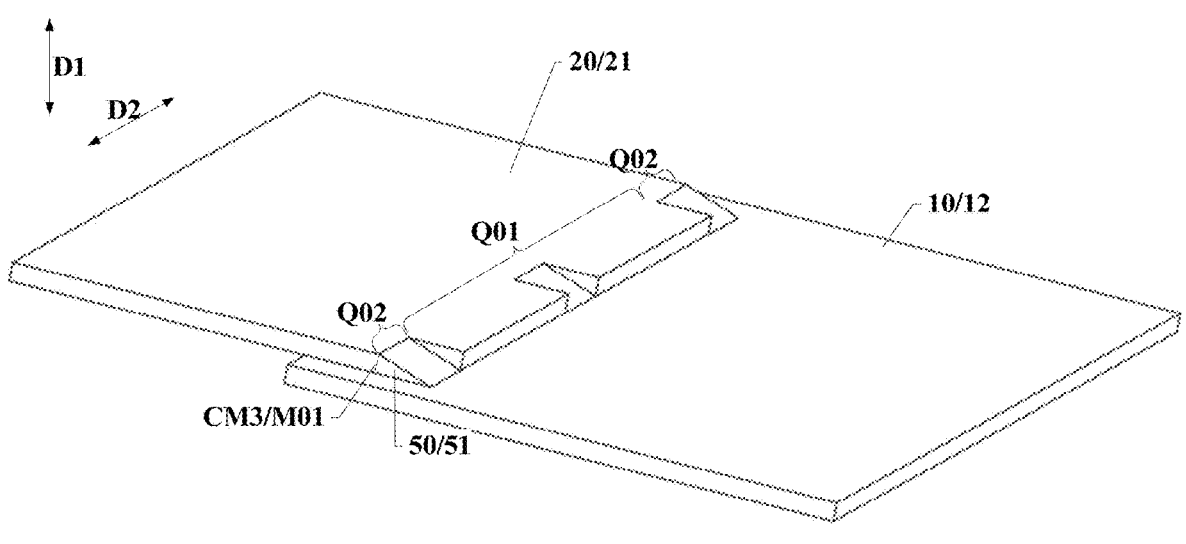
FIG. 14 illustrates another relative positional relationship diagram between a flexible circuit board and a display panel according to embodiments of the present disclosure.

It should be noted that FIG. 13 merely shows a scheme of arranging the first inclined structure 51 only at the place of the second area Q02 corresponding to the third side surface CM3. In some embodiments, in addition to providing the first inclined structure 51 at the place of the second area Q02, the first inclined structure 51 can also be provided to at least a portion of the first area Q01. FIG. 14 shows another relative positional relationship diagram of the flexible circuit board 20 and the display panel 10. Since the first inclined structure 51 has been set up in the second area Q02, it is beneficial to further setting up the first inclined structure 51 in the first area Q01 to improve the waterproof performance of the display module.

Optionally, the first inclined structure 51 in some embodiments is integrally formed with the first portion 21 of the flexible circuit board 20 into a single piece. For example, the first inclined structure 51 can be obtained by grinding the flexible circuit board 20 using edge grinding technology.

Continuing to refer to FIG. 13, in some embodiments, the display module also includes a first flat structure 60. The first flat structure 60 is located in the first area Q01. The first flat structure 60 is in contact with the third side surface CM3 and has a surface that is connected and flush with the second surface M2.

Specifically, when the first inclined structure 51 is introduced at a place corresponding to the second area Q02, optionally, the first inclined structure 51 is integrally formed with the flexible circuit board 20 into a single piece, which can be achieved by applying an edge grinding process to the flexible circuit board 20. The first flat structure 60 located in the first area Q01 can be regarded as a structure retained without grinding the flexible circuit board 20. The first flat structure 60 is also a part of the flexible circuit board 20. A surface of a first flat structure 60 away from the display panel 10 and a surface of the first portion 21 of the flexible circuit board 20 away from the display panel 10 are located on the same plane and are an integrally formed single structure with the first portion 21. This makes the first inclined structure 51 and the first flat structure 60 both integrated with the flexible circuit board 20, which is beneficial to simplifying the overall structure of the display module and reducing the manufacturing process of the display module.

Figure 15:
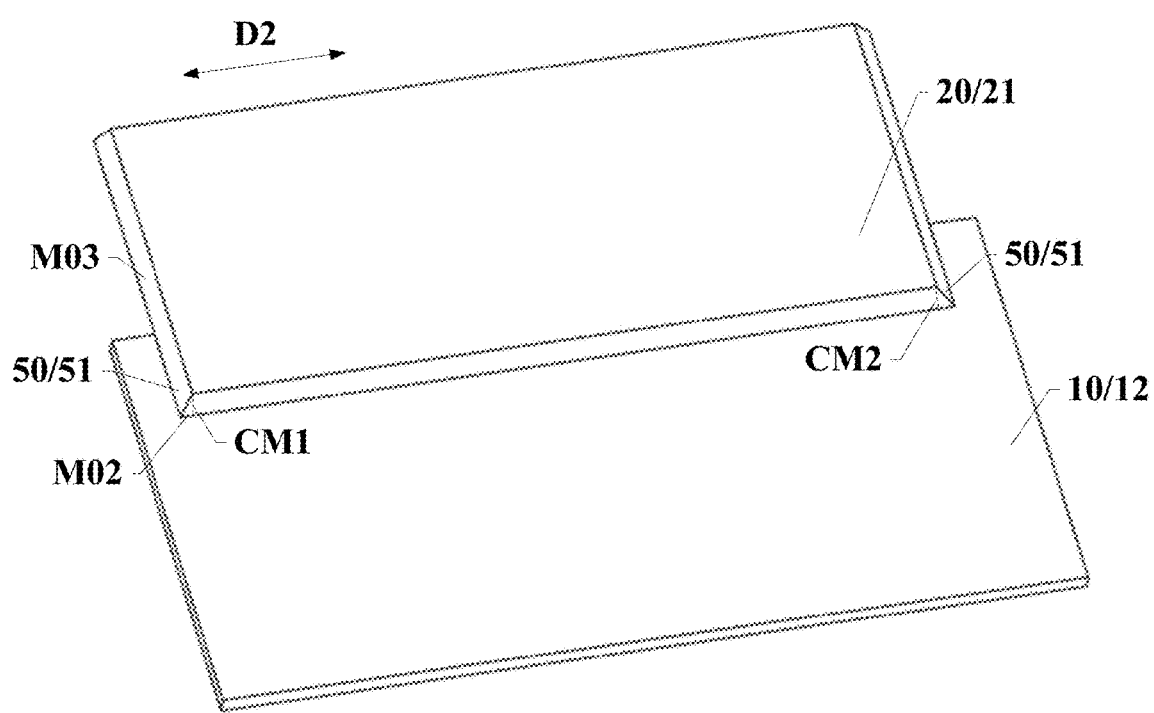
FIG. 15 illustrates another relative positional relationship diagram between a flexible circuit board and a display panel according to embodiments of the present disclosure.

In some embodiments, a scheme is shown to introduce the first inclined structure 51 on one side of the third side surface CM3 of the flexible circuit board 20. In some embodiments, the first inclined structure 51 can also be arranged on the first side surface CM1 and the second side surface CM2 of the flexible circuit board 20, as shown in FIG. 15. FIG. 15 shows another relative positional relationship diagram of the flexible circuit board 20 and the display panel 10 according to embodiments of the present disclosure.

Please refer to FIG. 15. In an optional embodiment of the present disclosure, at least a portion of the first inclined structure 51 is disposed on one side of the first side surface CM1 away from the second side surface CM2. At least a portion of the first inclined structure 51 is connected to the first side surface CM1. At least a portion of the first inclined structure 51 is provided on one side of the second side surface CM2 away from the first side surface CM1, and is connected to the second side CM2.

The first portion 21 of the flexible circuit board 20 includes a first side surface CM1 and a second side surface CM2 that are oppositely arranged along the second direction D2. Embodiments of the present disclosure show that one side of the first side surface CM1 away from the second side surface CM2 and one side of the second side surface CM2 away from the first side surface CM1 respectively introduce a first inclined structure 51. Alternatively, the first inclined structure 51 is integrally formed with the first portion 21 into a single piece, or the first inclined structure 51 is integrally formed with the adhesive element of the conductive cloth 30 into a single piece. Embodiments of the present disclosure only take a scheme in which the first inclined structure 51 and the first portion 21 of the flexible circuit board 20 are integrally formed as an example for description.

When the first inclined structure 51 is introduced on one side of the first side surface CM1 and one side of the second side surface CM2 respectively, the first inclined structure 51 can lower a step difference between a place of the first portion 21 of the flexible circuit board 20 on both the first side surface CM1 and the second side surface CM2 and the display panel 10. This is beneficial to avoiding the formation of a gap or a hole between the first side surface CM1 and the conductive cloth 30 as well as between the second side surface CM2 and the conductive cloth 30. A lateral binding force of the conductive cloth 30 on the first part 21 is also enhanced to improving a waterproof performance of an entire display module as well as the display stability of the display module.

It should be noted that in some embodiments, the first inclined structure 51 can be introduced respectively on the first side surface CM1, the second side surface CM2, and the third side surface CM3 of the first portion 21 of the flexible circuit board 20. The first inclined structure 51 reduces a step difference between different sides of the flexible circuit board 20 and the display panel 10. Therefore, it is more beneficial to improving the binding reliability of the conductive cloth 30 and the flexible circuit board 20, which is further beneficial to improving the overall waterproof performance and display reliability of the display module.

Figure 16:
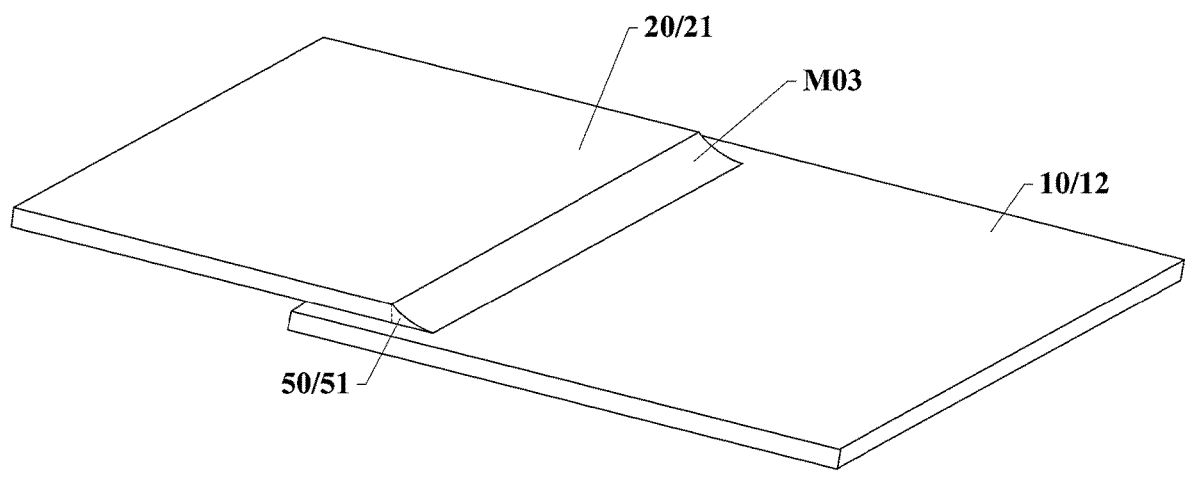
FIG. 16 illustrates another relative positional relationship diagram between a flexible circuit board and a display panel according to embodiments of the present disclosure.
Figure 17:
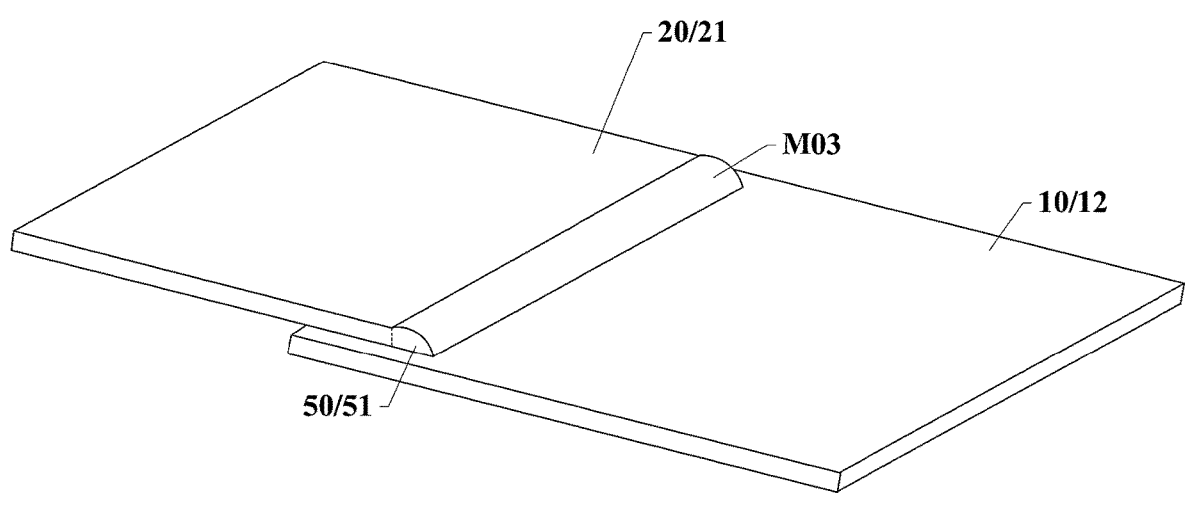
FIG. 17 illustrates another relative positional relationship diagram between a flexible circuit board and a display panel according to embodiments of the present disclosure.

Please refer to FIG. 2 in conjunction with FIG. 16 and FIG. 17. FIG. 16 and FIG. 17 respectively show additional relative positional relationship diagrams of the flexible circuit board 20 and the display panel 10 according to embodiments of the present disclosure. In an optional embodiment of the present disclosure, the inclined plane M03 is an inclined flat structure, or the inclined plane M03 includes a concave arc surface, or the inclined plane M03 includes a convex arc surface.

When the first inclined structure 51 is introduced into the display module, the first inclined structure 51 can be used to reduce a step difference between the first portion 21 of the flexible circuit board 20 and the display panel 10. The inclined plane M03 of the first inclined structure 51 can be embodied as a flat structure as shown in FIG. 2, or as a concave arc structure as shown in FIG. 16, or as a convex arc structure as shown in FIG. 17. Whether the inclined plane M03 of the first inclined structure 51 is embodied as a flat structure, a concave arcuate structure, or a convex arcuate structure, it can be realized through edge grinding technology. When the first inclined structure 51 and the flexible circuit board 20 are integrally formed into a single piece, the introduction of the inclined plane M03 in the first inclined structure 51 is more beneficial than a vertical side surface of the flexible circuit board 20 or the display panel 10 to improve the binding reliability of the conductive cloth 30 and the flexible circuit board 20. Thus, it avoids a gap or a hole that can allow liquid to penetrate between the conductive cloth 30 and the flexible circuit board 20, which is beneficial to improving the overall waterproof performance of the display module and a display effect of the display module.

Please refer to FIG. 2 and FIG. 15. In an optional embodiment of the present disclosure, in the first inclined structure 51 arranged on different side surfaces, a shape of the inclined plane M03 and an angle between the inclined plane M03 and the second plane M02 are all identical.

Specifically, when the first inclined structure 51 is introduced on different side surfaces of the first portion 21 of the flexible circuit board 20, embodiments of the present disclosure further define angles between the inclined plane M03 of different inclined structures and the second plane M02 of the first inclined structure 51 are all identical. Thus, in the actual manufacturing process, different first inclined structures 51 can be made with a same specification, and there is no need to introduce different specifications for a first inclined structure 51 at a different position. Therefore, it is beneficial to simplifying the manufacturing process of the first inclined structure 51 and improving the overall production efficiency of the display module.

Figure 18:
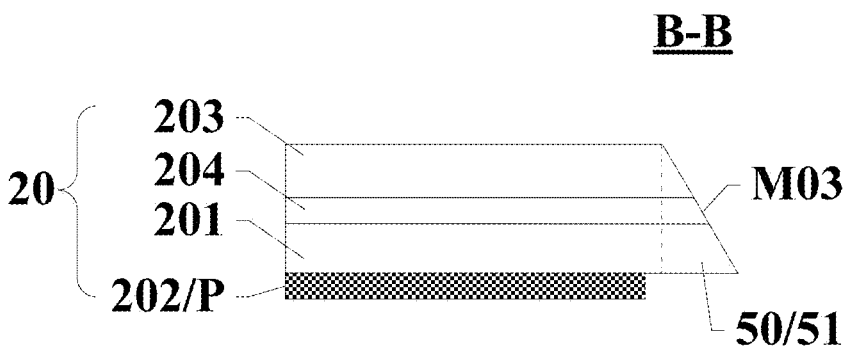
FIG. 18 illustrates a cross-sectional view of a flexible circuit board along the BB direction in FIG. 3.

FIG. 18 shows a cross-sectional view of the flexible circuit board 20 in FIG. 3 along a BB-direction. Please refer to FIG. 2 and FIG. 18. In an optional embodiment of the present disclosure, the flexible circuit board 20 includes a base material layer 201 and a metal layer 202 located on one side of the base material layer 201. The metal layer 202 includes a plurality of gold fingers P. The first inclined structure 51 is formed by a non-metal layer including the base material layer 201.

The flexible circuit board 20 includes a base material layer 201 and a metal layer 202 located on one side of the base material layer 201. The metal layer 202 includes a gold finger P. When the flexible circuit board 20 is bound to the display panel 10, the purpose is to achieve an electrical connection between the gold finger P on the flexible circuit board 20 and a binding pad on the display panel 10, further realizing an electrical connection between the flexible circuit board 20 and the display panel 10. When the first inclined structure 51 is introduced into the display module and the first inclined structure 51 and the flexible circuit board 20 are an integrated structure, the first inclined structure 51 can be obtained by processing the flexible circuit board 20 through edge grinding technology. This embodiment defines that when the first inclined structure 51 is formed by the flexible circuit board 20 including a non-metal layer such as the base material layer 201, it means that at least a portion of the first inclined structure 51 is located on the base material layer 201. At least a portion of the first inclined structure 51 is formed by other non-metallic layers except the metal layer 202. A formation of the first inclined structure 51 will not affect the gold finger. Therefore, it will not affect the impedance and other properties of the gold finger. This can ensure a reliability of the electrical connection and a stability of signal transmission between the gold finger of the flexible circuit board 20 and the display panel 10.

Please continue to refer to FIG. 2 and FIG. 18. In an optional embodiment of the present disclosure, the flexible circuit board 20 also includes a base film layer 203 located on one side of the base material layer 201 away from the metal layer 202. An inclined plane M03 is located on the base material layer 201 and the base film layer 203.

Optionally, the base material layer 201 and the base film layer 203 in the flexible circuit board 20 can be fixed by a glue 204. When the first inclined structure 51 is obtained by edge grinding the flexible circuit board 20, the inclined plane M03 can be obtained by grinding the base material layer 201 and the base film layer 203, then the first inclined structure 51 is obtained. The edge grinding process will avoid the metal layer 202, that is, it will avoid a gold finger, thereby avoiding any impact on the gold finger. In this embodiment, the inclined plane M03 is provided on the base material layer 201 and the base film layer 203 so that the first inclined structure 51 and the flexible circuit board 20 are integrally formed into a single piece. It is only necessary to form the first inclined structure 51 on the flexible circuit board 20 through an edge grinding process, which is beneficial to simplifying the overall manufacturing process of the display module and the production efficiency of the display module.

Figure 19:
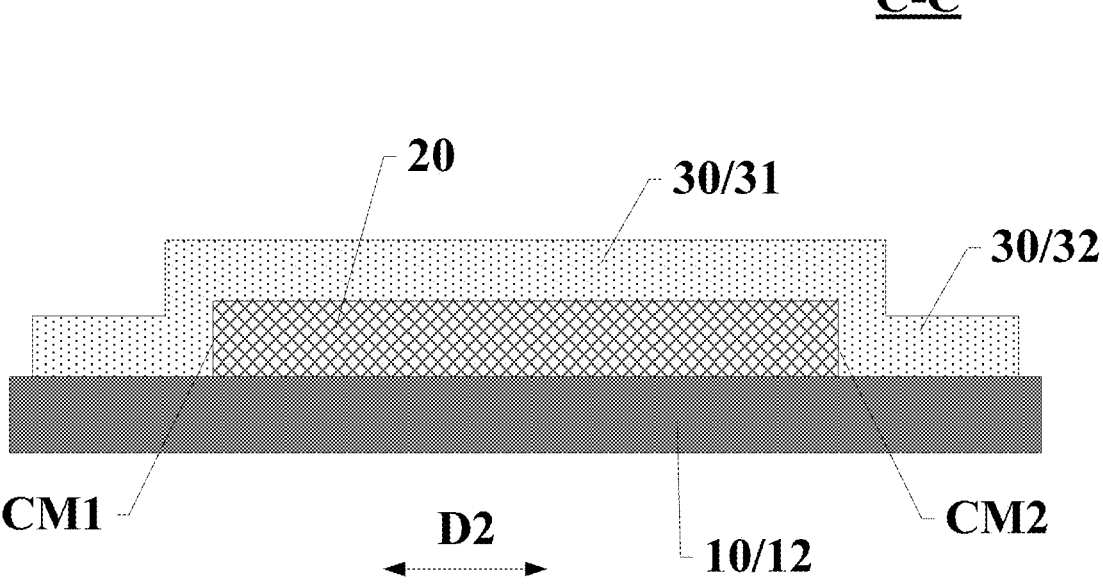
FIG. 19 illustrates a cross-sectional view along the CC direction in FIG. 5.

FIG. 19 shows a cross-sectional view along CC in FIG. 5. This embodiment shows a scheme for improving the conductive cloth 30.

Please refer to FIG. 19. In an optional embodiment of the present disclosure, the extension portion 32 in the conductive cloth 30 is bound to the display panel 10. Along the second direction D2, the extension portion 32 covers at least a portion of the first side surface CM1 and the second side surface CM1.

As shown in FIG. 5 and FIG. 19, a portion of the conductive cloth 30 located on one side surface of the flexible circuit board 20 away from the display panel 10 is the main portion 31. A portion extending from the main body portion 31 along the second direction D2 is an extension portion 32. The extension portion 32 is equivalent to two lug structures provided on both sides of the main body portion 31 along the second direction D2. In this embodiment, the extension portion 32 is used to cover at least a portion of the first side surface CM1 and at least a portion of the second side surface CM2 of the first portion 21 of the flexible circuit board 20.

If the extension portion 32 is not introduced into the conductive cloth 30, at least a portion of both sides of the third side surface CM3 of the flexible circuit board 20 along the second direction D2 is exposed. Therefore, liquid is likely to penetrate from the third side surface CM3 of the flexible circuit board 20 into the binding place of the flexible circuit board 20 and the display panel 10 along both sides of the second direction D2. In this embodiment, when the extension portion 32 is introduced into the conductive cloth 30, the extension portion 32 is essentially located on both sides of the third side surface CM3 along the second direction D2. When at least a portion of the first side surface CM1 and at least a portion of the second side surface CM2 are covered by the extension portion 32, it is equivalent to a path for liquid to penetrate from both sides of the third side surface CM3 along the second direction D2. In this way, while covering an upper surface of the first part 21 of the flexible circuit board 20, the conductive cloth 30 further extends along a direction where a side surface of the flexible circuit board 20 locates to fix with the display panel 10, blocking the path of liquid penetration as a whole. Therefore, this method is also conducive to improving the overall waterproof performance of the display module and the display stability of the display module.

Figure 20:
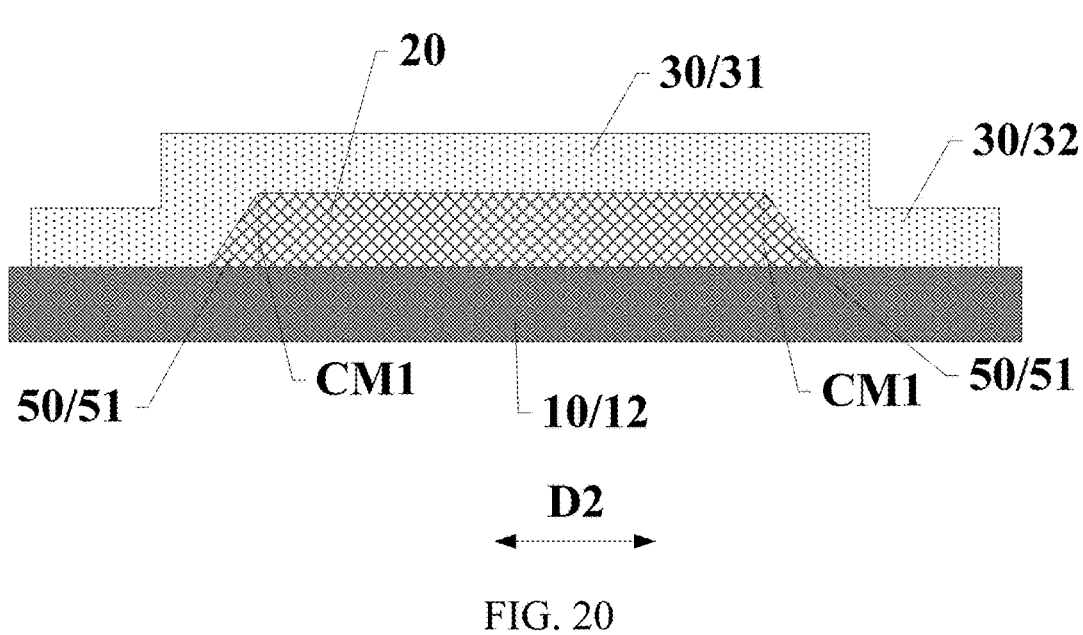
FIG. 20 illustrates another cross-sectional view along the CC direction in FIG. 5.

It should be noted that when the conductive cloth 30 includes the extension portion 32 connected to the main body portion 31, the first inclined structure 51 is introduced on at least one side surface of the first side surface CM1, the second side surface CM2 and the third side surface CM3 of the flexible circuit board 20 to compensate a step difference between the flexible circuit board 20 and the display panel 10. For example, please refer to FIG. 20. This embodiment shows a solution of introducing the first inclined structure 51 on the first side surface CM1 and the second side surface CM3. Of course, the first inclined structure can also be introduced on the third side surface, as shown in FIG. 2. The integration of the first inclined structure 51 and the extension portion 32 of the conductive cloth 30 is more beneficial to improving the waterproof performance and display reliability of the display panel 10. FIG. 20 shows another cross-sectional view along CC direction in FIG. 5.

Figure 21:
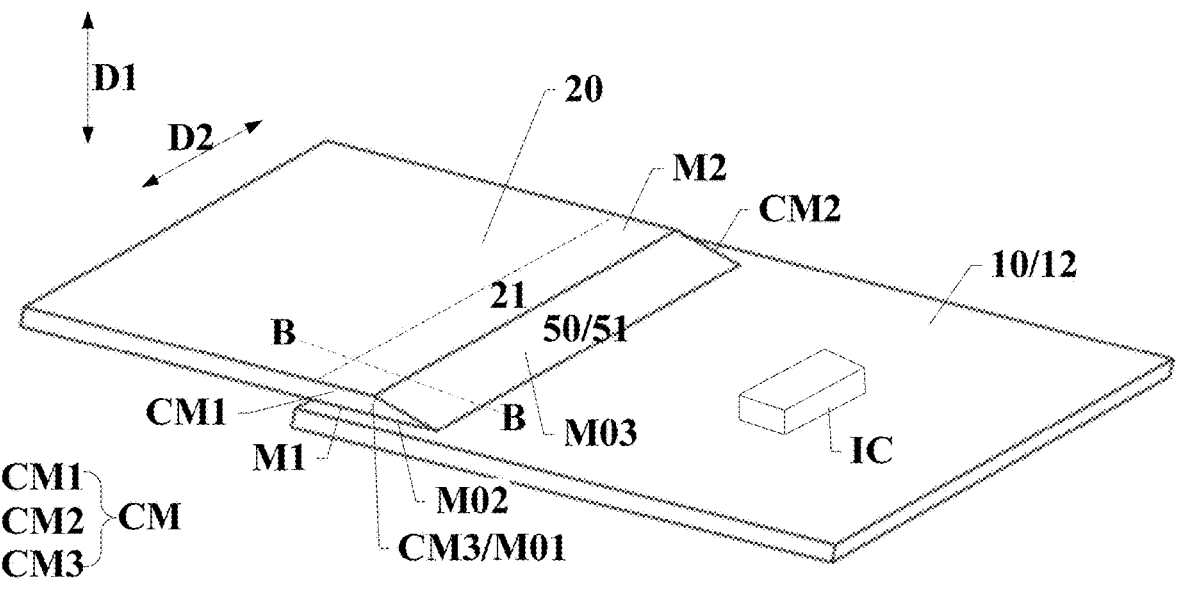
FIG. 21 illustrates a relative positional diagram of a display panel, a flexible circuit board, and a driver chip in the display module.
Figure 22:
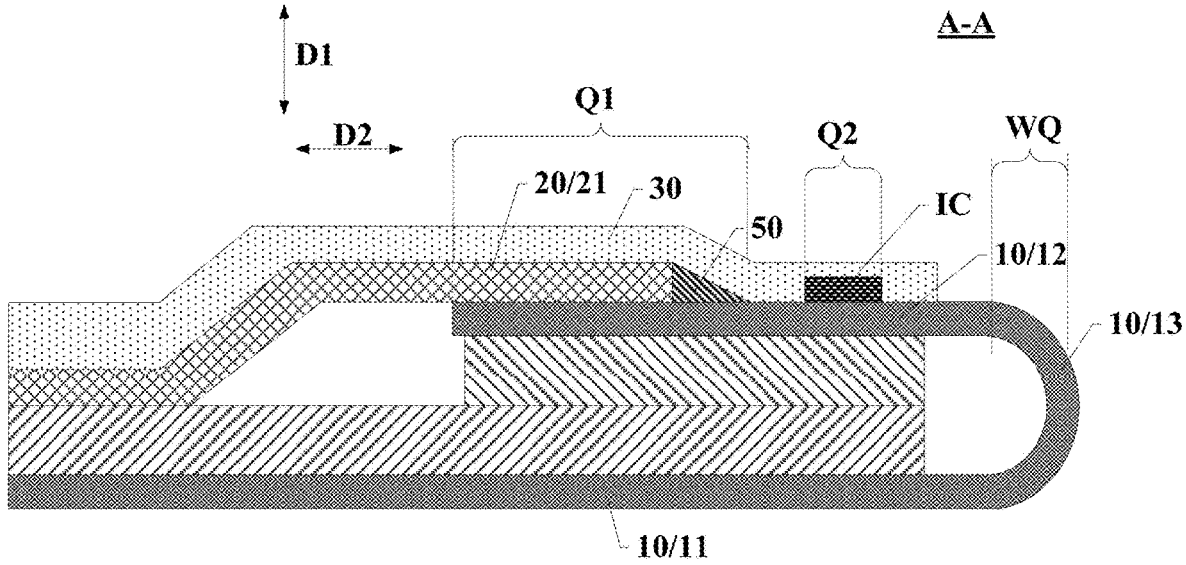
FIG. 22 illustrates another cross-sectional view of a display module along the AA direction in FIG. 1.
Figure 23:
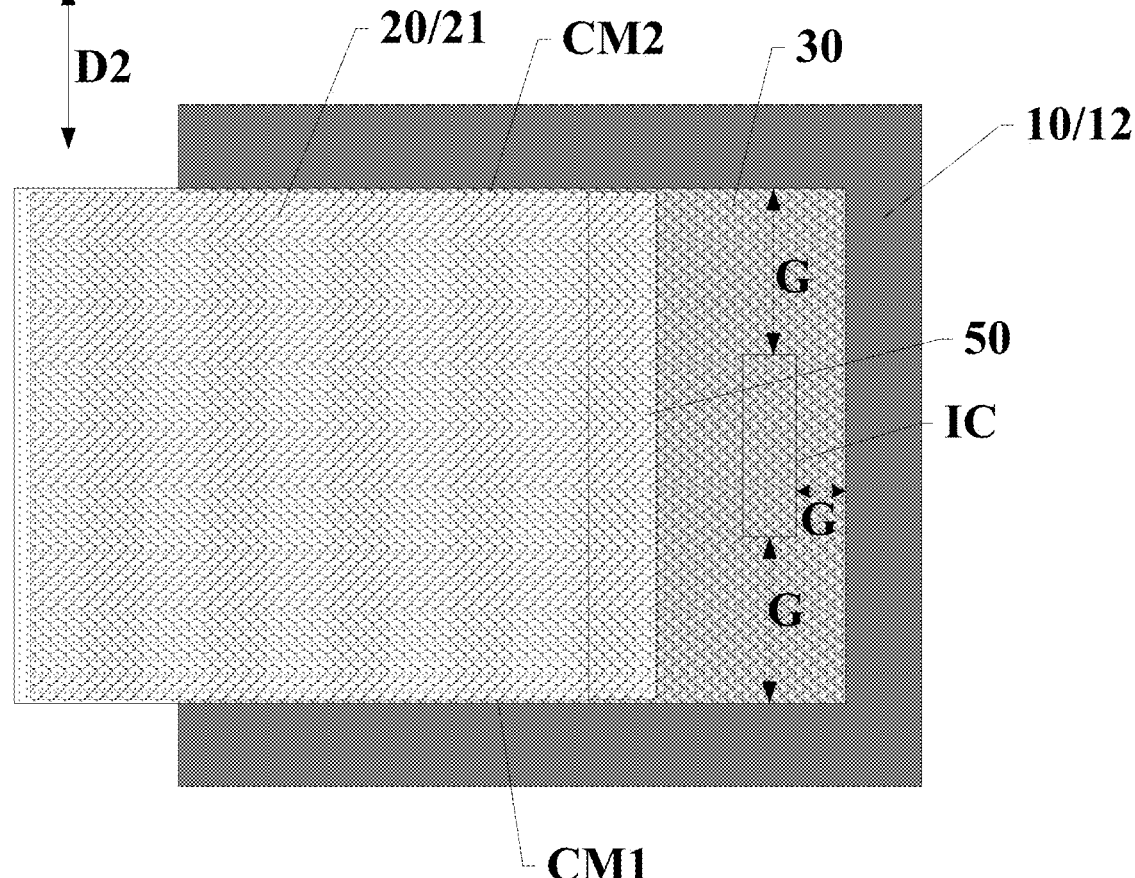
FIG. 23 illustrates a top view positional relationship diagram of a display panel, a flexible circuit board, and a driver chip in the display module.

FIG. 21 shows a relative positional relationship diagram of the display panel 10, the flexible circuit board 20, and a driver chip IC in the display module. FIG. 22 shows another cross-sectional view of the display module along AA direction in FIG. 1. FIG. 21 and FIG. 22 illustrate schemes when the display module includes a driver chip IC. FIG. 23 shows a top view positional relationship diagram of the display panel 10, the flexible circuit board 20, and the driver chip IC in the display module. Please refer to FIG. 1, FIG. 21, FIG. 22, and FIG. 23. In an optional embodiment of the present disclosure, the display panel 10 further includes a bending area WQ and a second binding area Q2 disposed on a non-light-exiting surface. The second binding area Q2 is located between the first binding area Q1 and the bending area WQ.

The display module also includes a driver chip IC. The driver chip IC is bound to the second binding area Q2. Along the second direction D2, a width of the driver chip IC is smaller than a width of the flexible circuit board 20. The second direction D2 is perpendicular to an arrangement direction of the first binding area Q1 and the second binding area Q2. The conductive cloth 30 also covers the driver chip IC. Along a direction parallel to the light-exiting surface of the display module, there is a first gap G between an end of the conductive cloth 30 and an end of the driver chip IC.

In the display module, the display panel 10 is bound to the driver chip IC and the flexible circuit board 20 respectively, and can be electrically connected to the driver chip IC and the flexible circuit board 20 respectively. The flexible circuit board 20 and the driver chip IC jointly control the display panel 10 to perform the display function. In order to avoid the influence of external liquid on the binding place between the driver chip IC and the display panel 10, and to avoid the influence on the binding place between the flexible circuit board 20 and the display panel 10, embodiments of the present disclosure introduce a conductive cloth 30 to cover the flexible circuit board 20 and the driver chip IC. Since the width of the driver chip IC along the second direction D2 is smaller than the width of the flexible circuit board 20 along the second direction D2, when the conductive cloth 30 of a same width is used for covering operation, the conductive cloth 30 can cover and seal the driver chip IC. There is a first gap G between the end of the conductive cloth 30 and the end of the driver chip IC. That is to say, the conductive cloth 30 not only covers the driver chip IC, but also further extends outward from the end of the driver chip IC and then is bonded to the display panel 10. In this way, the driver chip IC will be isolated from the outside world through the conductive cloth 30, and external liquid will not be able to penetrate into the binding place between the driver chip IC and the display panel 10. This will help improve the reliability of the electrical connection between the display panel 10 and the driver chip IC, further benefiting avoiding an issue of display abnormality caused by liquid erosion at the binding place between the display panel 10 and the driver chip IC. Thus, it is helpful to improve the display reliability of the display module.

Please refer to FIG. 1 and FIG. 2. In an optional embodiment of the present disclosure, the display panel 10 includes a first flat portion 11, a second flat portion 12, and a bending portion 13 connecting the first flat portion 11 and the second flat portion 12. The second flat portion 12 is bent to the back of the first flat portion 11 through the bending portion 13. The first binding area Q1 is located on the second flat portion 12. Optionally, the first flat portion 11, the second flat portion 12, and the bending portion 13 in the display panel 10 are integrally formed.

Specifically, this embodiment describes a structure of the display panel 10 in the display module. Optionally, the display panel 10 is a flexible display panel 10. A display surface of the display panel 10 is located in the first flat portion 11. The second flat portion 12 is used to arrange a binding area for binding with the flexible circuit board 20 or the driver chip IC. The second flat portion 12 is bent to the back of the first flat portion 11 through the bending portion 13. The flexible circuit board 20 and the driver chip IC are located on the back of the first flat portion 11. If the binding area of the display panel is set on one side of the light-exiting surface, the driver chip or the flexible circuit board bound to the binding area will inevitably occupy the frame space of the display module, making it difficult for the display module to achieve narrow frame design. In some embodiments, the binding area is arranged on the back of the first flat portion 11, which is equivalent to arranging the binding area together with the flexible circuit board 20 and the driver chip IC bound to the binding area on the non-light-exiting surface of the display module. This does not occupy the space in the frame area of the display module, so it is conducive to realizing the narrow frame design of the display module and improving the screen-to-body ratio of the display module.

Figure 24:
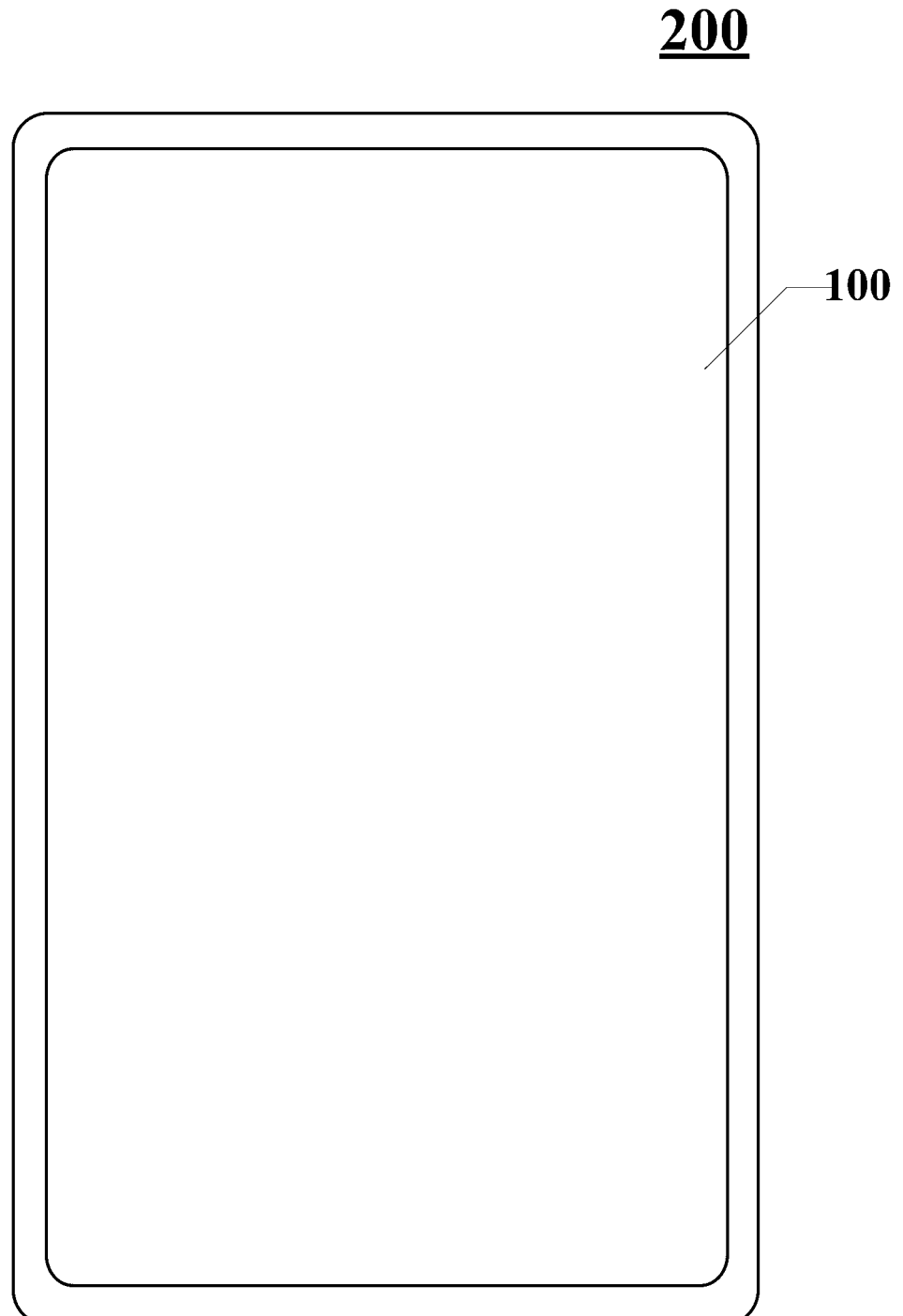
FIG. 24 illustrates a schematic diagram of a display device according to embodiments of the present disclosure.

FIG. 24 is a schematic diagram of a display device provided by embodiments of the present disclosure. Please refer to FIG. 24. The present disclosure also provides a display device 200. The display device 200 includes a display module 100. A display panel is any display module 100 provided in this disclosure.

It should be noted that, for the display device provided by embodiments of the present disclosure, reference may be made to embodiments of the display module mentioned above, which will not be described again. The display device provided in this disclosure can be a mobile phone, a tablet computer, a television, a monitor, a notebook computer, a vehicle display screen, a navigator, or any other products and components having a display function. The display device provided by embodiments of the present disclosure has advantages of the display panel provided by embodiments of the present disclosure. For details, please refer to the specific description of the display panel in some embodiments, and it will not be described again here.

It can be seen from embodiments of the present disclosure that the display module and display device at least achieve the following advantages.

Embodiments of the present disclosure improve the structure of the display module. One implementation method is that the display module further includes a compensation structure. The compensation structure is in contact with at least a portion of the side surface, and the conductive cloth covers the compensation structure. In some embodiments, a compensation structure is introduced between the conductive cloth and at least a portion of the side surface of the first portion of the flexible circuit board. The compensation structure is in contact with the side surface and the conductive cloth respectively. By this way, the compensation structure is used to make up for the step difference on the side surface of the flexible circuit board, increasing the binding reliability between the conductive cloth and the compensation structure, which helps to avoid the issue of occurring a gap or a hole between the side surface of the flexible circuit board and the conductive cloth. Therefore, it helps to prevent liquid such as sweat from penetrating into the binding place between the flexible circuit board and the display panel from the gap or the hole, causing issue of display abnormality. Therefore, it will help improve the waterproof performance of the display module, which will in turn help improve the display stability of the display module.

Another feasible implementation provided by embodiments of the present disclosure is to improve the structure of the conductive cloth. The conductive cloth includes a main body portion and an extension portion located on both sides of the main body portion along the second direction and connected to the main body portion. The main body portion contacts the second surface of the flexible circuit board. The extension portion is located on both sides of the third side surface of the flexible circuit board along the second direction. When the conductive cloth is arranged on the side of the flexible circuit board away from the display panel, in order to improve the fixing reliability of the conductive cloth in the display module, the conductive cloth can be extended from the second surface of the flexible circuit board toward the bending area of the display module, and then pasted and fixed with the display panel. If the extension portion is not introduced into the conductive cloth, at least a portion of both sides of the third side surface of the flexible circuit board along the second direction are exposed. Therefore, liquid is likely to penetrate from the third side surface of the flexible circuit board along the second direction into the binding place between the flexible circuit board and the display panel. Therefore, embodiments of the present disclosure introduce an extension portion connected to the main body portion in the conductive cloth. The extension portion is located on both sides of the third side surface of the flexible circuit board along the second direction. In this way, the extension can cover both sides of the third side surface along the second direction of the flexible circuit board, blocking liquid from entering the binding place between the flexible circuit board and the display panel from both sides of the third side surface along the second direction. It is also conducive to improving the overall waterproof performance of the display module and the display stability of the display module.

Although embodiments of the present disclosure have been described in detail by examples, those persons of ordinary skill in the art will understand that the above examples are for illustration only and are not intended to limit the scope of the invention. Those persons of ordinary skill in the art will understand that the above embodiments can be modified without departing from the scope and spirit of the invention. The scope of the invention is defined by claims.

What is claimed is:

1. A display module, comprising:
a display panel, wherein the display panel comprises a first binding area disposed on a non-light-exiting surface;
a flexible circuit board, wherein
the flexible circuit board comprises a first portion bound to the first binding area of the display panel; the first portion comprises a first surface and a second surface oppositely arranged along a first direction; the first surface is disposed between the second surface and the display panel; the first direction is perpendicular to a light-exiting surface of the display panel; the first portion comprises a side surface located between the first surface and the second surface; the side surface comprises a first side surface, a second side surface, and a third side surface; the first side surface and the second side surface are oppositely arranged along a second direction; and the third side surface connects to the first side surface and the second side surface respectively;
a conductive cloth, located on one side of the flexible circuit board away from the display panel, and covering at least a portion of the first binding area; and
a compensation structure, wherein
the compensation structure is in contact with at least a portion of the side surface, and the conductive cloth covers the compensation structure; or the conductive cloth comprises a main body portion and an extension portion that is located on both sides of the main body portion along the second direction; the extension portion connects to the main body portion; and the main body portion is in contact with the second surface and the extension portion is located on both sides of the third side surface along the second direction.

2. The display module according to claim 1, wherein
the compensation structure comprises a first inclined structure; the first inclined structure comprises a first plane connected to the side surface, a second plane connected to the display panel, and an inclined plane connecting the first plane and the second plane; the inclined plane is unparallel to the first plane or the second plane, and the inclined plane is located on a side of the first plane away from the side surface; and
a side of the first plane away from the display panel is flush with the second surface.

3. The display module according to claim 2, wherein the first inclined structure is integrally formed with the flexible circuit board into one single piece.

4. The display module according to claim 2, wherein the conductive cloth comprises a base and an adhesive element disposed on one side of the base, and the first inclined structure is integrally formed with the adhesive element into one single piece.

5. The display module according to claim 2, wherein at least a portion of the first inclined structure is located on a side of the third side surface away from the first portion and is connected to the third side surface.

6. The display module according to claim 5, wherein along the second direction, a length of the first inclined structure is equal to a length of the third side surface.

7. The display module according to claim 5, wherein
along the second direction, the length of the first inclined structure is shorter than the length of the third side surface; and
the third side surface comprises a first area and a second area located on both sides of the first area along the second direction, and the first inclined structure is located at least in the second area.

8. The display module according to claim 7, further comprising a first flat structure located in the first area, wherein
the first flat structure is connected to the third side surface; and the first flat structure has a surface that is connected and flush with the second surface.

9. The display module according to claim 2, wherein at least a portion of the first inclined structure is disposed on a side of the first side surface away from the second side surface and connected to the first side surface; and at least a portion of the first inclined structure is disposed on a side of the second side surface away from the first side surface and connected to the second side surface.

10. The display module according to claim 2, wherein the inclined plane is an inclined flat structure, or the inclined plane comprises a concave arc surface, or the inclined plane comprises a convex arc surface.

11. The display module according to claim 2, wherein a shape of the inclined plane disposed on different side surfaces of the first inclined structure is same; and an angle between the inclined plane and the second plane on different side surfaces of the first inclined structure is same.

12. The display module according to claim 2, wherein an angle between the inclined plane and the second plane is θ, and θ≤48.2°.

13. The display module according to claim 3, wherein the flexible circuit board comprises a base material layer and a metal layer that is disposed on one side of the base material layer; the metal layer comprises a plurality of gold fingers; and the first inclined structure is formed by a non-metal layer comprising the base material layer.

14. The display module according to claim 13, wherein the flexible circuit board further comprises a base film layer located on a side of the base material layer away from the metal layer, and the inclined plane is located in the base material layer and the base film layer.

15. The display module according to claim 1, wherein the extension portion is attached to the display panel; and along the second direction, the extension portion covers at least a portion of the first side surface and the second side surface.

16. The display module according to claim 1, wherein the display panel further comprises a bending area and a second binding area disposed on the non-light-exiting surface, and the second binding area is located between the first binding area and the bending area.

17. The display module according to claim 16, further comprising a driver chip, wherein the driver chip is bound to the second binding area; along the second direction, a width of the driver chip is smaller than a width of the flexible circuit board; and the second direction is perpendicular to an arrangement direction of the first binding area and the second binding area; and the conductive cloth covers the driver chip; along a direction parallel to the light-exiting surface of the display module; and a first gap is disposed between an end of the conductive cloth and an end of the driver chip.

18. The display module according to claim 1, wherein the display panel comprises a first flat portion, a second flat portion, and a bending portion connecting the first flat portion and the second flat portion; the second flat portion is bent to a back side of the first flat portion through the bending portion; and the first binding area is located in the second flat portion.

19. A display device, comprising:

a display module, comprising:

a display panel, wherein the display panel comprises a first binding area disposed on a non-light-exiting surface;

a flexible circuit board, wherein the flexible circuit board comprises a first portion bound to the first binding area of the display panel; the first portion comprises a first surface and a second surface oppositely arranged along a first direction; the first surface is disposed between the second surface and the display panel; the first direction is perpendicular to a light-exiting surface of the display panel; the first portion comprises a side surface located between the first surface and the second surface; the side surface comprises a first side surface, a second side surface, and a third side surface; the first side surface and the second side surface are oppositely arranged along a second direction; and the third side surface connects to the first side surface and the second side surface respectively;

a conductive cloth, located on one side of the flexible circuit board away from the display panel, and covering at least a portion of the first binding area; and a compensation structure, wherein the compensation structure is in contact with at least a portion of the side surface, and the conductive cloth covers the compensation structure; or the conductive cloth comprises a main body portion and an extension portion that is located on both sides of the main body portion along the second direction; the extension portion connects to the main body portion; and the main body portion is in contact with the second surface and the extension portion is located on both sides of the third side surface along the second direction.

* * * * *